(12) United States Patent
Schweikert et al.

(10) Patent No.: US 6,951,806 B1
(45) Date of Patent: Oct. 4, 2005

(54) METAL REGION FOR REDUCTION OF CAPACITIVE COUPLING BETWEEN SIGNAL LINES

(75) Inventors: Daniel G. Schweikert, San Jose, CA (US); John F. MacDonald, Lake Oswego, OR (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/452,367

(22) Filed: Nov. 30, 1999

(51) Int. Cl.[7] .................. H01L 21/9763; H01L 21/338
(52) U.S. Cl. ..................... 438/622; 438/183; 438/618; 438/923; 438/926
(58) Field of Search .................... 257/776, 758, 257/773, 711, 221.444; 438/618, 622, 98, 438/625, 593, 592, 926, 118, 623, 183, 923; 333/1, 246; 174/36

(56) References Cited

U.S. PATENT DOCUMENTS

| | | | | |
|---|---|---|---|---|
| 5,135,889 A | * | 8/1992 | Allen .......................... | 437/195 |
| 5,196,377 A | * | 3/1993 | Wagner et al. .............. | 438/384 |
| 5,262,353 A | * | 11/1993 | Sun et al. .................... | 438/400 |
| 5,321,283 A | | 6/1994 | Cogan et al. ................ | 257/256 |
| 5,371,321 A | * | 12/1994 | Hamzehdoost et al. .... | 174/52.4 |
| 5,418,504 A | * | 5/1995 | Nottenburg .................... | 333/1 |
| 5,446,243 A | * | 8/1995 | Crowder et al. ............ | 174/250 |
| 5,761,049 A | * | 6/1998 | Yoshidome et al. ........ | 361/782 |
| 5,798,298 A | * | 8/1998 | Yang et al. .................. | 438/622 |
| 5,847,381 A | * | 12/1998 | Isogai ...................... | 250/208.1 |
| 5,854,503 A | | 12/1998 | Hsueh et al. ................ | 257/347 |
| 5,880,024 A | * | 3/1999 | Nakajima et al. ........... | 438/669 |
| 5,915,201 A | * | 6/1999 | Chang et al. ................ | 438/631 |
| 5,994,765 A | | 11/1999 | Mitra et al. .................. | 257/659 |
| 6,001,710 A | | 12/1999 | Francois et al. ............. | 438/454 |
| 6,022,787 A | * | 2/2000 | Ma .............................. | 438/422 |
| 6,097,092 A | * | 8/2000 | Natzle .......................... | 257/758 |
| 6,166,440 A | * | 12/2000 | Yang ............................ | 257/758 |
| 6,180,430 B1 | * | 1/2001 | Kong et al. ................... | 438/30 |
| 6,396,146 B2 | * | 5/2002 | Nakayama ................... | 257/758 |
| 6,465,339 B2 | * | 10/2002 | Brankner et al. ........... | 438/622 |
| 6,605,873 B1 | * | 8/2003 | Vigna et al. ................. | 257/758 |
| 6,649,997 B2 | * | 11/2003 | Koike .......................... | 257/259 |
| 2002/0000663 A1 | * | 1/2002 | Nakayama ................... | 257/758 |

FOREIGN PATENT DOCUMENTS

| | | |
|---|---|---|
| JP | 04-313300 | * 11/1992 |
| JP | 405343546 | * 12/1993 |

OTHER PUBLICATIONS

Stan Gibilisco, "Dictionary of Electronics", TAB Books, 1993, p. 277.*

Kwon, "Closely Packed Microstrip Lines as Very High Speed Chip to Chip Interconnects," Sep. 1987, vol. CHMT-10 No. 3, p. 314-15.*

* cited by examiner

*Primary Examiner*—Carl Whitehead, Jr.
*Assistant Examiner*—James Mitchell
(74) *Attorney, Agent, or Firm*—Gunnison, McKay & Hodgson, L.L.P.; Serge J. Hodgson

(57) ABSTRACT

A structure includes a substrate, first and second signal lines above the substrate, where unused substrate surface area exists between the first and second signal lines, and a first shield line in the unused substrate surface area. To define the first shield line, the signal line layout which includes the first and second signal lines is defined. Any areas which are not signal lines are then defined as unused areas of the substrate. The shield lines including the first shield line are then defined in portions of the unused areas of the substrate. In this manner, shield lines are automatically designed at every available location without requiring any allocation of substrate surface area.

14 Claims, 3 Drawing Sheets

METAL REGION FOR REDUCTION OF CAPACITIVE COUPLING BETWEEN SIGNAL LINES

FIELD OF THE INVENTION

The present invention relates to signal lines on an electronic device. More particularly, the present invention relates to a method and structure for reducing capacitive coupling between signal lines on a microelectronic device.

BACKGROUND OF THE INVENTION

Integrated circuits and other microelectronic devices utilize signal lines for a variety of reasons. For example, signal lines are used to route logic signals. Signal lines are typically formed of metal such as aluminum or copper, although essentially any electrically conductive material such as doped polysilicon and silicide can be used. Signal lines are formed using well known techniques, such as by forming and patterning an electrically conductive layer or by selectively depositing an electrically conductive layer.

As the art moves towards higher density reduced feature size integrated circuits, the spacing between signal lines decreases. Decreasing the spacing between signal lines undesirably increases the capacitive coupling between adjacent signal lines. This capacitive coupling can degrade device performance. For example, a change in voltage on a first signal line can be capacitively coupled to an adjacent second signal line thus inducing an instantaneous voltage on the second signal line. This induced voltage may be confused as a valid logic signal causing logic errors in the integrated circuit.

To reduce or prevent capacitive coupling between signal lines, it has become known to place a shield line between adjacent signal lines. FIG. 1 is a perspective view of a structure 10 which includes a shield line 12 interposed between adjacent signal lines 14, 16 in accordance with the prior art. Shield line 12, signal lines 14, 16 are all part of a single conductor layer M1, for example, are part of the metal one layer. Typically, shield line 12, signal lines 14, 16 are on an electrically insulating layer above a semiconductor substrate.

As those skilled in the art understand, signal lines are part of various conductor layers (often referred to as metal layers) formed above one another. These conductor layers are electrically isolated from one another by electrically insulating layers such as silicon oxide layers. Electrically conductive vias electrically connect corresponding signal lines between conductor layers.

In this illustration, shield line 12 is electrically connected to a reference line 22 which is part of a conductor layer M2 (e.g. the metal two layer) by a via 20. Reference line 22, in turn, is electrically connected to a reference line 26 which is part of a conductor layer M3 (e.g. the metal three layer) by a via 24. Reference line 26 is electrically connected to a voltage source 18. For example, voltage source 18 is a reference voltage source, i.e., is ground.

Since shield line 12 is electrically connected to voltage source 18, shield line 12 is held at a common potential. Thus, induced voltages do not appear on shield line 12. As a result, signal lines 14, 16 are shielded from one another by shield line 12.

Signal lines 14, 16 and shield line 12 are typically designed using an automated routing program. As those skilled in the art understand, such routing programs operate using a point to point designation. In particular, a designer specifies the points which need connection and the routing program automatically lays out the signal lines and vias required to make the point to point connections while at the same time allocating area for the shield lines. The shield lines are then laid out in this allocated area. Thus, to form structure 10, the routing program automatically allocates a particular area (or percentage) of the total substrate surface area to accommodate shield line 12, vias 20, 24 and reference lines 22, 26. However, this undesirably increases the overall length of the signal lines as discussed in more detail with reference to FIG. 2. As used herein, the term "substrate surface area" and similar terms are used generally to represent the cumulative area of each conductor layer.

FIG. 2 is a top plan view of structure 10 of FIG. 1. As shown in FIG. 2, the routing program allocates significant area to accommodate shield line 12. In particular, an area having a width equal to a distance CD between signal line 14 and shield line 12 plus a distance FW equal to the width of shield line 12 is allocated to accommodate shield line 12. To minimize this area, the distanced CD is the minimum distance allowable between features (hereinafter referred to as critical distance CD) and the distance FW is the minimum allowable width of a feature (hereinafter referred to as the minimum feature width FW). Illustratively, critical distance CD is 0.2 μm and minimum feature width FW is also 0.2 μm although other values can be used depending upon the particular design.

The routing program also allocates a significant area to accommodate the electrical connection of shield line 12 to voltage source 18. In particular, via 20 is offset from via 24 by a via offset distance VO. This offset is required due to design rules which prevent a via from being formed directly on top of an underlying via. This offset also requires reference line 22 to be provided to electrically connect vias 20, 24. Since a similar offset is required for each conductor layer and there are several conductor layers, e.g. six or more, this offset is repeated several times and requires the allocation of a substantial area of the substrate.

Accordingly, the routing program allocates a substantial percentage of the total substrate surface area to accommodate shield line 12 and the electrical connection of shield line 12 to voltage source 18. Since the signal lines must be routed around this allocated area, the overall length of the signal lines increases. However, it is desirable to decrease the overall length of the signal lines to improve performance of the integrated circuit. Thus, the art needs a method of providing shield lines without having to allocate a percentage of the total substrate surface area for the shield line and/or for the electrical connection of the shield line to the voltage source.

SUMMARY OF THE INVENTION

In accordance with the present invention, a structure which includes first and second signal lines and a first shield line positioned between but separated from the first and second signal lines is presented. The first shield line is electrically floating.

The structure is designed using a conventional automated routing program. Since the first shield line is electrically floating, electrical connections between the first shield line and a voltage source are not made. Thus, the routing program does not allocate any area for the various reference lines and vias which would otherwise be required to connect the first shield line to a voltage source as in the prior art. Of importance, the routing program uses this saved area for other uses, e.g. for routing of necessary signal lines. In this manner, the efficiency of use of the substrate surface area is increased resulting in higher performance integrated circuits compared to the prior art.

In one embodiment, the first shield line is electrically connected to a second shield line. The first and second shield lines are part of a single conductor layer.

Alternatively, the first shield line is part of a first conductor layer and the second shield line is part of a second conductor layer. In this alternative, the first and second shield lines are electrically connected by a via provided at the natural intersection of the first and second shield lines. In other words, where a via connection between the first and second shield lines is permissible, a via is formed. To accomplish this, area for via connections is designated after the shield line layout is designed. This is in contrast to the prior art where area for vias used with the shield lines is designated at the same time as the overall layout and accordingly require the routing program to allocate area for the vias. Since the need to allocate area for shield line vias is eliminated, area on the substrate is saved. Again, the routing program uses this saved area for necessary signal lines thus improving the efficiency of use of the substrate surface area compared to the prior art.

In yet another embodiment, the first and second shield lines are electrically connected to additional shield lines. As the number of interconnected electrically floating shield lines increases, the induced voltage on any particular shield line of the interconnected electrically floating shield lines is dampened. Dampening the induced voltage results in a relatively stable voltage on the shield lines over time. Thus, although the shield lines are electrically floating, by connecting a large number of shield lines together, the shield lines behave essentially as if they are connected to a voltage source and provide effective shielding.

In accordance with an alternative embodiment, a structure includes a substrate, first and second signal lines above the substrate, where unused substrate surface area exists between the first and second signal lines, and a first shield line in the unused substrate surface area. This structure is designed using a conventional automated routing program in combination with a conventional geometric analyzer.

In defining a signal line layout with a routing program, a substantial percentage of the substrate surface area is not utilized. In accordance with this embodiment, the first shield line is formed in this unused substrate surface area. To define the first shield line, the routing program defines the signal line layout which includes the first and second signal lines. The geometric analyzer is then instructed to define any areas which are not signal lines as unused areas of the substrate. The shield lines including the first shield line are then defined as any portions of the unused areas of the substrate which: (1) are located at a distance at least equal to the critical distance away from a signal line; and (2) have a width at least equal to the minimum feature width. In this manner, shield lines in accordance with the invention are automatically designed at every available location within the signal line layout.

Of importance, the geometric analyzer defines the shield lines in unused areas of the substrate and the routing program does not allocate area for the shield lines. In this manner, the efficiency of use of the substrate surface area is increased resulting in higher performance integrated circuits compared to the prior art.

In one embodiment, the first shield line is electrically connected to a second shield line on a different conductor layer by a via provided at the natural intersection of the first and second shield lines. The first and second shield lines are electrically floating. Alternatively, the second shield line is a power line or a ground line. In this manner, the first and second shield lines are held at a common potential and are extremely effective at reducing or eliminating capacitive coupling between the signal lines.

Also in accordance with the present invention, a method includes forming first and second signal lines above a substrate and forming a first shield line between the first and second signal lines. The first shield line is electrically floating.

In an alternative embodiment, a method includes defining a signal line layout which includes a plurality of signal lines. The method further includes defining any area of the signal line layout which is not one of the plurality of signal lines as unused area. At least one shield line is then defined in the unused area.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

Figure 1:
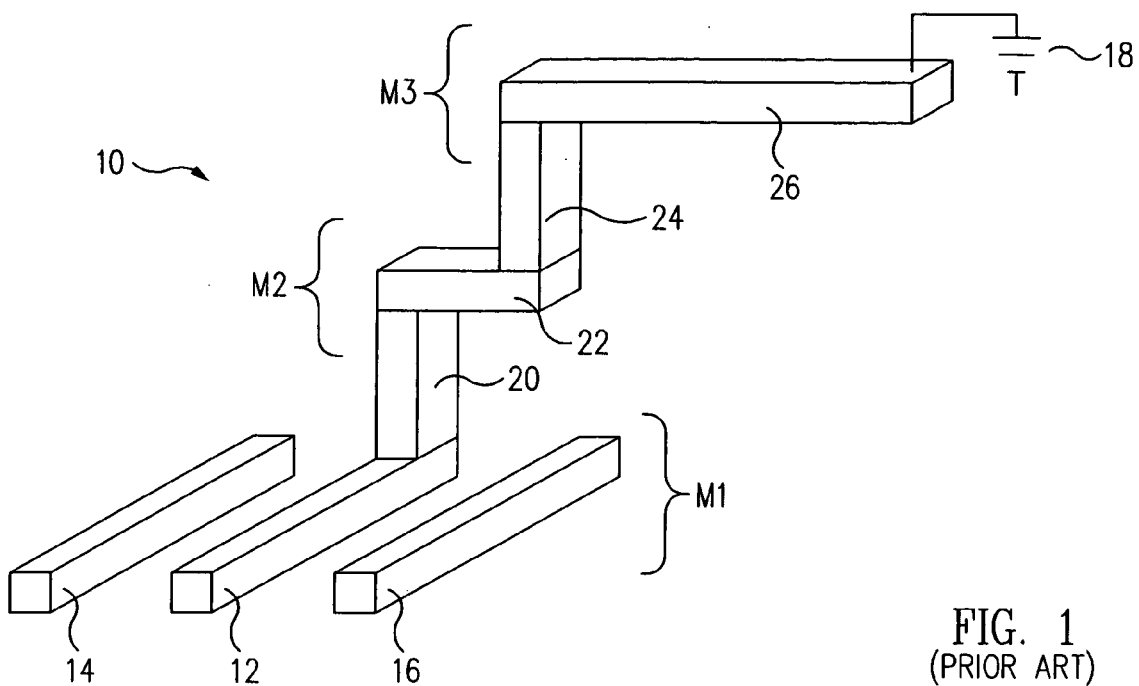
FIG. 1 is a perspective view of a structure which includes a shield line interposed between adjacent signal lines in accordance with the prior art.
Figure 2:
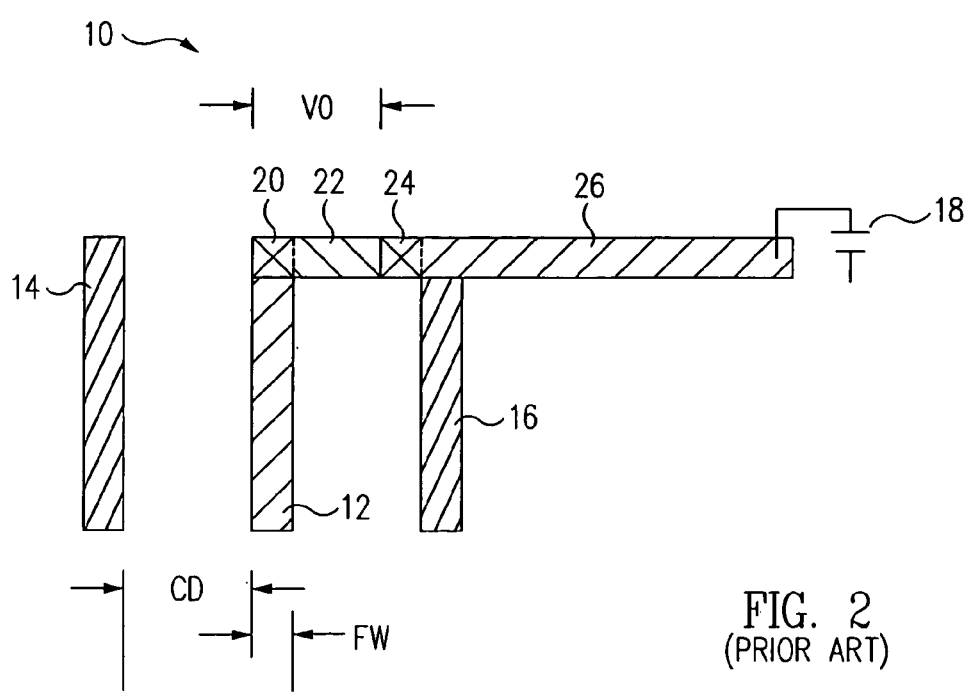
FIG. 2 is a top plan view of the structure of FIG. 1 in accordance with the prior art.

In accordance with the present invention, a structure 100 (FIG. 3) which includes signal lines 106, 108 and a shield line 102 between signal lines 106, 108 is presented. Shield line 102 is electrically floating.

Structure 100 is designed using a conventional automated routing program. Since shield line 102 is electrically floating, electrical connections between shield line 102 and a voltage source are not made. Thus, the routing program does not allocate any area for the various reference lines and vias which would otherwise be required to connect shield line 102 to a voltage source as in the prior art. Of importance, the routing program uses this saved area for other uses, e.g. for routing of necessary signal lines. In this manner, the efficiency of use of the substrate surface area is increased resulting in higher performance integrated circuits compared to the prior art.

In one embodiment, shield line 102 is electrically connected to a shield line 104. Shield lines 102, 104 are part of a single conductor layer.

In an alternative embodiment, shield line 102 is electrically connected to a shield line 300A. Shield line 102 is part of a first conductor layer and shield line 300A is part of a second conductor layer. In this embodiment, shield lines 102, 300A are electrically connected by a via 302A provided at the natural intersection of shield lines 102, 300A. In other words, where a via connection between shield lines 102, 300A is permissible, via 300A is formed. To accomplish this, area for via connections is designated after the shield line layout is designed. This is in contrast to the prior art where area for vias used with the shield lines is designated at the same time as the overall layout and accordingly require the routing program to allocate area for the vias. Since the need to allocate area for shield line vias is eliminated, area on the substrate is saved. Again, the routing program uses this saved area for other uses thus improving the efficiency of use of the substrate surface area compared to the prior art.

In yet another embodiment, shield lines 102, 104 are electrically connected to one another and to additional shield lines, e.g., shield line 300A. As the number of interconnected electrically floating shield lines increases, the induced voltage on any particular shield line of the interconnected electrically floating shield lines is dampened. Dampening the induced voltage results in a relatively stable voltage on the shield lines over time. Thus, although the shield lines are electrically floating, by connecting a large number of shield lines together, the shield lines behave essentially as if they are connected to a voltage source and provide effective shielding.

In accordance with an alternative embodiment (FIG. 5), a structure 200 includes a substrate, signal lines 208, 210 above the substrate, where unused substrate surface area exists between signal lines 208, 210, and a shield line 202 in the unused substrate surface area. Structure 200 is designed with a conventional automated routing program in combination with a conventional geometric analyzer.

In defining a signal line layout with a routing program, a substantial percentage of the substrate surface area is not utilized. In accordance with this embodiment, shield line 202 is formed in this unused substrate surface area. To define shield line 202, the routing program defines the signal line layout which includes signal lines 208, 210. The geometric analyzer is then instructed to define any areas which are not signal lines as unused areas of the substrate. The shield lines including shield line 202 are then defined as any portions of the unused areas of the substrate which: (1) are located at a distance at least equal to the critical distance away from a signal line; and (2) have a width at least equal to the minimum feature width. In this manner, shield lines in accordance with the invention are automatically designed at every available location in the signal line layout.

Of importance, the geometric analyzer defines the shield lines in unused areas of the substrate and the routing program does not allocate area for the shield lines. In this manner, the efficiency of use of the substrate surface area is increased resulting in higher performance integrated circuits compared to the prior art.

In one embodiment, shield line 202 is electrically connected with a shield line 300B on a different conductor layer by a via 304B provided at the natural intersection of shield lines 202, 300B. Shield lines 202, 300B are electrically floating. Alternatively, shield line 300B is a power line or a ground line. In this manner, shield lines 202, 300B are held at a common potential and are extremely effective at reducing or eliminating capacitive coupling between the signal lines.

Figure 3:
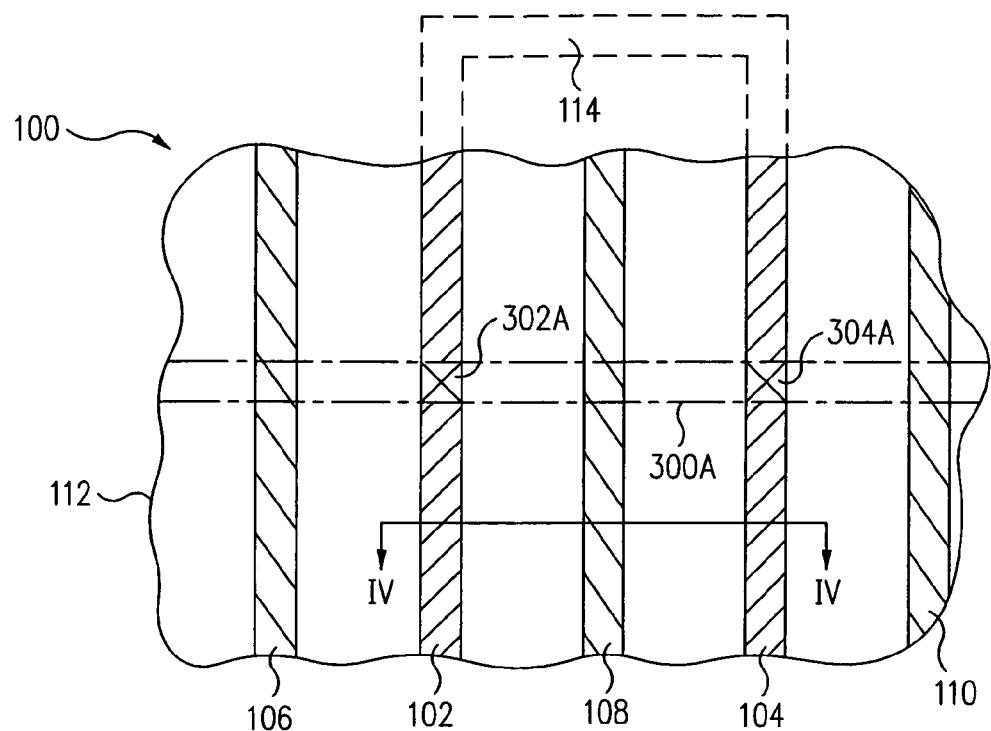
FIG. 3 is a top plan view of a structure which includes shield lines between signal lines in accordance with the present invention.

In more detail, FIG. 3 is a top plan view of structure 100 which includes shield lines 102 and 104 positioned between but separated from signal lines 106, 108 and 108, 110, respectively. Shield lines 102, 104 and signal lines 106, 108, 110 are all part of a single conductor layer. This conductor layer can be any conductor layer, e.g. the conductor layer closest to the substrate or an interlayer conductor layer or even the top conductor layer. Structure 100 is a portion 112 of a larger substrate such as an integrated circuit.

Structure 100 is typically designed using a conventional automated routing program such as "IC CRAFTSMAN®" router from Cadence Design, Inc. located in San Jose, Calif. In accordance with this embodiment, shield lines 102, 104 are not electrically connected to other conductor layers or to a voltage source. Thus, the routing program does not allocate any area for the various reference lines and vias which would otherwise be required to connect shield lines 102, 104 to a voltage source as in the prior art (e.g., see vias 20, 24 and reference lines 22, 26 of FIG. 1). Since the need to allocate area for shield line vias is eliminated, area on the substrate is saved. Of importance, the routing program uses this saved area for other uses, e.g. for routing of necessary signal lines. In this manner, the efficiency of use of the substrate surface area is increased, e.g., the overall length of signal lines is reduced, resulting in higher performance integrated circuits compared to the prior art.

Since shield lines 102, 104 are not electrically connected to a voltage source, shield lines 102, 104 are electrically floating. For simplicity of discussion, shield line 102 and capacitive coupling from signal line 106 to signal line 108 will be discussed. It is understood that similar considerations apply to capacitive coupling from signal line 108 to signal line 106. Further, similar considerations apply to shield line 104 and capacitive coupling between signal lines 108, 110.

Since shield line 102 is floating, a change in voltage on signal line 106 is capacitively coupled to shield line 102 and induces an instantaneous voltage change on shield line 102. This induced voltage change on shield line 102, in turn, induces a voltage change on signal line 108. To prevent device malfunction, it is critical that this induced voltage on signal line 108 be within the tolerance for allowable voltage fluctuations.

The voltage induced on signal line 108 is controlled in large part by the area, and thus length, of shield line 102. In general, the greater the length of shield line 102, the less capacitive coupling between signal lines 106, 108. (Less capacitive coupling results in less induced voltage on signal line 108 and vice versa.) Conversely, the shorter the length of shield line 102, the greater capacitive coupling between signal lines 106, 108. In fact, when extremely short, shield line 102 can actually enhance capacitive coupling between signal lines 106, 108 compared to not having shield line 102, i.e. compared to having only electrically insulating material between signal lines 106, 108. Thus, the length, and accordingly area, of shield line 102 should be sufficient to prevent shield line 102 from enhancing capacitive coupling between signal lines 106, 108.

To reduce capacitive coupling between signal lines 106, 108, in one embodiment, shield line 102 is electrically connected to other shield lines. For example, shield line 102 is electrically connected to shield line 104 by a connector 114 in the same conductor level elsewhere on the substrate. This effectively increases the area of shield line 102, which as discussed above, reduces capacitive coupling between signal lines 106 and 108.

Further, by electrically interconnecting shield line 102 to shield line 104, capacitive coupling cancellation is promoted. To illustrate, assume a case where the signal level on signal line 106 changes from logic high to logic low, e.g. the voltage on signal line 106 changes from 1.8 volts to 0 volts. At the same time, the signal level on signal line 110 changes from logic low to logic high, e.g. the voltage on signal line 110 changes from 0 volts to 1.8 volts. Thus, shield line 102 sees a voltage change of −1.8 volts on signal line 106 and shield line 104 sees a voltage change of +1.8 volts on signal line 110. However, since shield lines 102, 104 are electrically connected to one another, the effect of the voltage changes of signal lines 106, 110 effectively cancel one another. Accordingly, signal line 108 is shielded from signal lines 106, 110.

To maximize the cancellation effect and provide effective shielding, in one embodiment, shield lines 102, 104 are electrically connected to a plurality of shield lines and/or are located adjacent a plurality of signal lines. As the number of interconnected electrically floating shield lines increases, the induced voltage on any particular shield line of the interconnected electrically floating shield lines is dampened. Dampening the induced voltage results in a relatively stable voltage on the shield lines over time. Thus, although the shield lines are electrically floating, by connecting a large number of shield lines together, the shield lines behave essentially as if they are connected to a voltage source and provide effective shielding.

Figure 4:
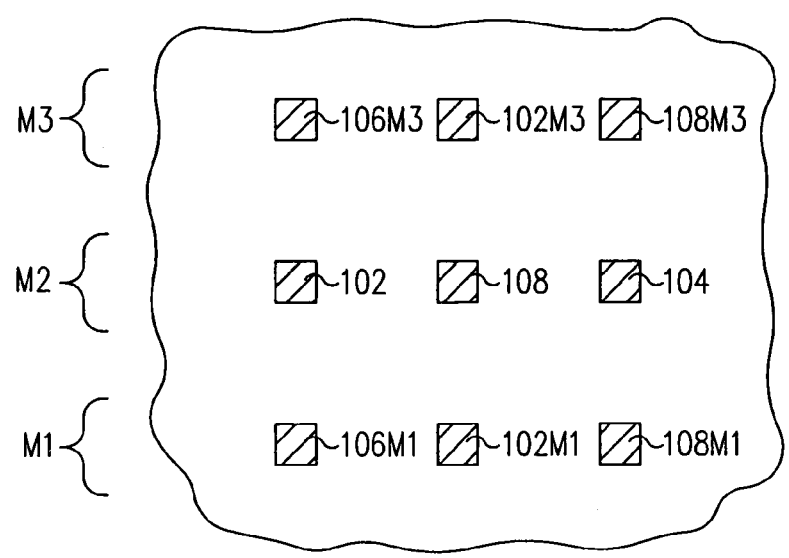
FIG. 4 is a cross-sectional view of the structure of FIG. 3 along the line IV—IV in accordance with one embodiment of the present invention.

Although shielding of signal lines 106, 108, 110 from one another is discussed, shield lines 102, 104 provide shielding in three dimensions as discussed in greater detail in regards to FIG. 4. More particularly, shield lines 102, 104 shield signal lines 106, 108, 110 from one another and from other signal lines of other conductor layers (e.g. from signal lines of underlying or overlying conductor layers).

FIG. 4 is a cross-sectional view of the structure of FIG. 3 along the line IV—IV in accordance with one embodiment of the present invention. In accordance with this embodiment, FIG. 3 is a top plan view of the conductor layer M2, e.g., the metal two layer. Accordingly, shield lines 102, 104 and signal line 108 in FIG. 4 are part of conductor layer M2. Referring to FIG. 4, located below (above) shield line 102, signal line 108 and shield line 104 are signal line 106M1 (106M3), shield line 102M1 (102M3) and signal line 108M1 (108M3), respectively. Signal lines 106M1 (106M3), 108M1 (108M3) and shield line 102M1 (102M3) are part of a conductor layer M1 (M3), e.g., the metal one (three) layer.

In accordance with this embodiment, shield line 102 in combination with shield line 102M1 (102M3) shield signal line 108 from signal line 106M1 (106M3). Similarly, shield line 104 in combination with shield line 102M1 (102M3) shield signal line 108 from signal line 108M1 (108M3). In this manner, shield lines 102, 104 shield signal line 108 from other signal lines on conductor layer M2 (e.g., shield lines 106, 110 of FIG. 3) and also from signal lines on underlying (overlying) conductor layer M1 (M3), e.g., from signal lines 106M1 (106M3), 108M1 (108M3).

Returning now to FIG. 3, although the routing program does not allocate any area for the various reference lines and vias which would otherwise be required to connect shield lines 102, 104 to a voltage source as in the prior art, the routing program still allocates area for shield lines 102, 104 themselves. Shield lines 102,104 are then designated either manually or automatically, in this allocate area.

To minimize this allocated area, shield lines 102, 104 are typically located from signal lines 106, 108 and 108, 110, respectively, the minimum distance allowable between features, i.e. critical distance CD. For the same reason, the width of shield lines 102, 104 is typically the minimum allowable width of a feature, i.e. is minimum feature width FW. Of importance, automated routing programs are well suited for automatically allocating area for shield lines 102, 104 using this criteria.

Figure 5:
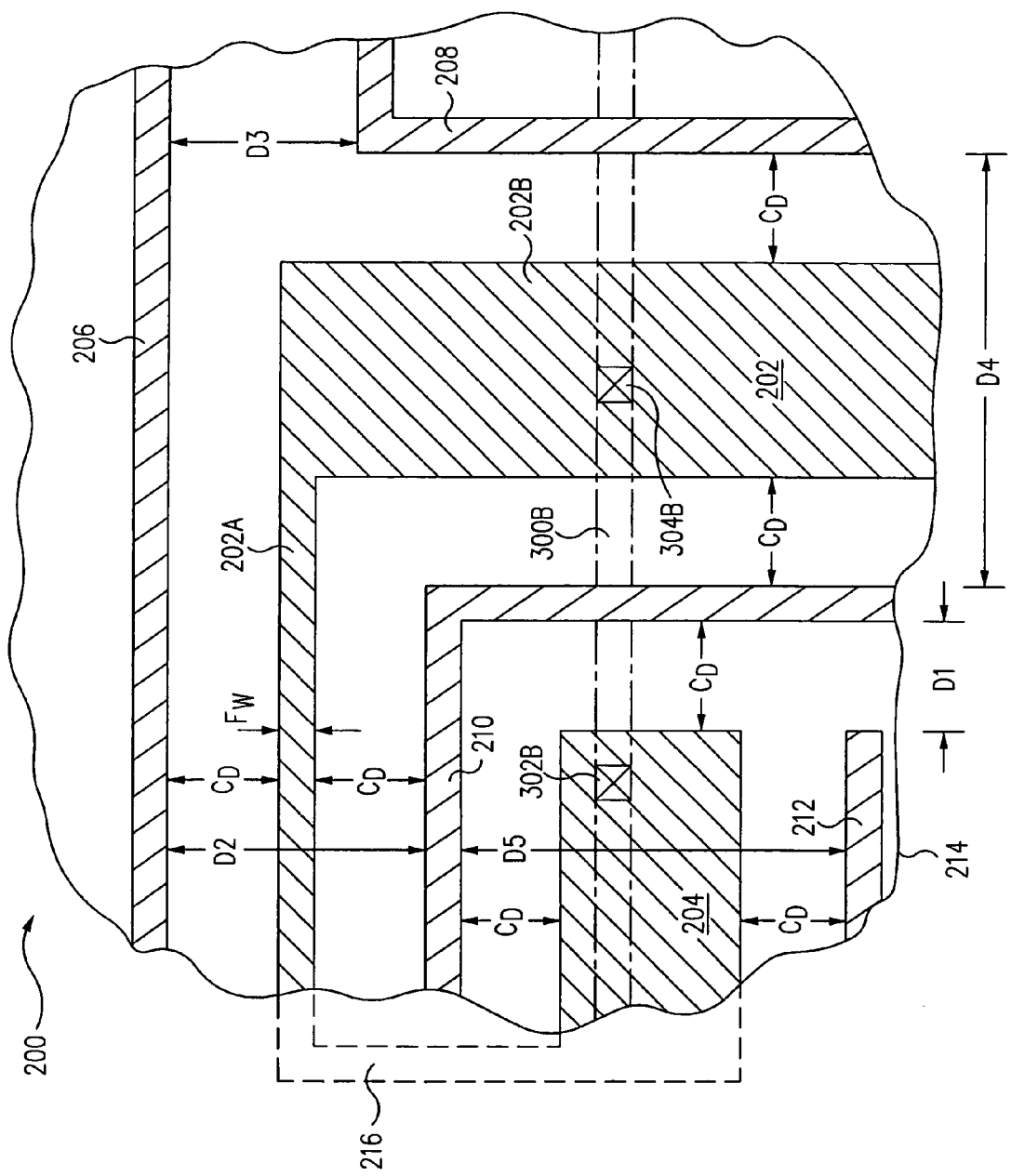
FIG. 5 is a top plan view of a structure which includes shield lines formed in unused substrate surface area and signal lines in accordance with the present invention.

Although the allocated area is minimized, it is desirable to avoid any allocation of area for shield lines 102, 104. FIG. 5 is a top plan view of a structure 200, in accordance with the present invention, which includes shield lines 202, 204 not requiring any allocation of area and signal lines 206, 208, 210, 212. Shield lines 202, 204 and signal lines 206, 208, 210, 212 are all part of a single conductor layer. This conductor layer can be any conductor layer, e.g. the conductor layer closest to the substrate or an interlayer conductor layer or even the uppermost conductor layer. Shield lines 202, 204 shield signal lines 206, 208, 210, 212 from one another in a manner similar to that discussed above in relation to shield lines 102, 104 and signal lines 106, 108, 110 of FIG. 3.

Referring still to FIG. 5, structure 200 is a portion 214 of a larger substrate such as an integrated circuit. Structure 200 is typically designed using a conventional automated routing program such as "IC CRAFTSMAN®" router from Cadence Design, Inc. in combination with a conventional geometric analyzer such as "DRACULA®" analyzer from Cadence Design, Inc. or "HERCULES" analyzer from Avant! Corporation located in Fremont, Calif.

In defining a signal line layout with a routing program, a substantial percentage of the substrate surface area is not utilized. In accordance with this embodiment, shield lines 202, 204 are formed in this unused substrate surface area. To define shield lines 202, 204, the routing program defines the signal line layout. The geometric analyzer is then instructed to define any areas of the signal line layout which are not signal lines as unused areas of the substrate. The shield lines are then defined as any portions of the unused areas of the substrate which: (1) are located at a distance at least equal to the critical distance away from a signal line or other feature; and (2) have a width at least equal to the minimum feature width. In this manner, shield lines in accordance with the invention are automatically designed at every available location within the signal line layout area.

Recall that in the prior art, area for shield lines is allocated at the same time that the signal lines are defined. Thus, two areas are allocated, one for the signal lines and one for the shield lines. In contrast, only an area substantially equivalent to the prior art signal line area is allocated for both the signal lines and the shield lines according to the invention. In particular, the geometric analyzer defines shield lines 202, 204 after signal lines 206, 208, 210, 212 are defined by the routing program thus avoiding the second allocation of area for shield lines that was required in the prior art. In this manner, the efficiency of use of the substrate surface area is increased resulting in higher performance integrated circuits compared to the prior art.

As set forth above, only a portion of the unused substrate surface area within the signal line layout is available. Typically, a distance at least equal to critical distance CD must exist between a shield line and a signal line (or other feature). Further, the shield line must typically have a width at least equal to the minimum feature width FW. To illustrate, signal line 212 is located at a distance D1 from signal line 210 in the horizontal direction of the page of FIG. 5. However, since distance D1 equals critical distance CD, the unused substrate surface area between signal lines 210, 212 in the horizontal direction is unavailable for a shield line.

To further illustrate, signal line 206 is located at a distance D2 from signal line 210. Distance D2 is the minimum distance between signal lines which allows a shield line to be placed between the signal lines. As shown in FIG. 5, this minimum distance D2 equals twice critical distance CD plus the minimum feature width FW. As an example, in the case where critical distance CD is 0.2 $\mu$m and minimum feature width FW is also 0.2 $\mu$m, distance D2 is 0.6 $\mu$m (distance D2=(2×0.2 $\mu$m)+0.2 $\mu$m).

Signal line 206 is located at a distance D3 from signal line 208. Distance D3 is greater than critical distance CD (distance D1), but is less than the minimum distance D2 between signal lines which allows a shield line to be placed between the signal lines. Thus, the unused substrate surface area between signal lines 206, 208 is unavailable for a shield line.

Signal line 210 is located at a distance D4 from signal line 208. Distance D4 is greater than the minimum distance D2 between signal lines which allows a shield line to be placed between the signal lines. This allows shield line 202 to have a width between signal lines 210, 208 greater than minimum feature width FW. Generally, the width of a shield line is made as great as possible while the distance between a shield line and a signal line is maintained at the critical distance CD. This is in contrast to the prior art where the shield line is made as narrow as possible, i.e. at the minimum feature width, to minimize the area allocated for the shield line.

Signal line 210 is located at a distance D5 from signal line 212 in the vertical direction of the page of FIG. 5. Distance D5 is greater than the minimum distance D2 between signal lines which allows a shield line to be placed between the signal lines. Similar to shield line 202, this allows shield line 204 to have a width between signal lines 210, 212 in the vertical direction greater than minimum feature width FW.

In some instances, the distance between signal lines is so great the placing a shield line between the signal lines actually enhances capacitive coupling between the signal lines compared to not having a shield line in between signal lines. In this case, a shield line is not placed between signal lines.

In accordance with one embodiment, shield lines 202, 204 are not electrically connected to other conductor layers or to a voltage source. As discussed above, this increases the efficiency of use of the substrate surface area resulting in higher performance integrated circuits compared to the prior art.

Since shield lines 202, 204 are not electrically connected to a voltage source, shield lines 202, 204 are electrically floating. Paying particular attention to shield line 202 and signal lines 206, 210, a change in voltage on signal line 206 is capacitively coupled to shield line 202 and induces a voltage change on shield line 202. Primarily, capacitive coupling occurs between signal line 206 and a narrow portion 202A of shield line 202 which runs along the length of signal line 206. However, since narrow portion 202A is connected to a wide portion 202B of shield line 202 having a greater width than narrow portion 202A, this capacitive coupling is distributed over a large area of shield line 202. The result is that the magnitude of the voltage induced on shield line 202 is small compared to having shield line 202 that consisted only of narrow portion 202A.

Further, since shield line 202 is located adjacent other signal lines such as signal line 208, capacitive coupling cancellation is promoted. For example, assume a case where the signal level on signal line 206 changes from logic high to logic low, e.g. the voltage on signal line 206 changes from +1.8 volts to 0 volts. At the same time, the voltage on signal line 208 changes from logic low to logic high, e.g. from 0 volts to +1.8 volts. Shield line 202 thus sees a voltage change of −1.8 volts on signal line 206 and +1.8 volts on signal line 208. As a result, the effects of the voltage changes on signal lines 206, 208 effectively cancel one another.

Further, shield lines 202, 204 can be connected to one another by a connector 216 in the same conductor level (indicated in dashed lines) elsewhere on the substrate to promote the cancellation effect. In accordance with this embodiment, signal lines 206, 208, 210, 212 all contribute to the floating voltage on shield lines 202, 204 which remains substantially constant over time.

In many of the embodiments discussed above, the shield lines are not connected with other conductor layers. However, in alternative embodiments, the shield lines are connected with other conductor layers. Referring to FIG. 3, shield line 300A, which is part of an upper (or lower) conductor layer is illustrated in broken lines. Shield line 300A is electrically connected to shield lines 102, 104 by vias 302A, 304A. Of importance, vias 302A, 304A are provided at the natural intersections of shield lines 102, 104 and shield line 300A. In other words, where a via connection between shield line 300A and shield lines 102, 104 is permissible, a via (i.e. vias 302A, 304A) is formed. To accomplish this, area for via connections is designated after the signal lines and shield lines are designed. This is in contrast to the prior art where area for vias used with the shield lines is designed at the same time as the overall layout and accordingly require the routing program to allocate area for the vias.

In one embodiment, shield line 300A is a floating shield line in accordance with the present invention. By connecting shield lines on various conductor layers, a greater number of shield lines can be connected together compared to the case where only shield lines of a single conductor layer are connected together. For example, three shield lines 102, 104, 300A of two conductor layers are connect together compared to the case where two shield lines 102, 104 of a single conductor layer are connected together. As discussed above, increasing the number of floating interconnected shield lines stabilizes the voltage on any particular shield line of the floating interconnected shield lines which reduces or eliminates capacitive coupling between signal lines.

In an alternative embodiment, shield line 300A is connected to power or ground and accordingly is a power or ground line, respectively. In this manner, shield lines 102, 104 are held at a common potential and are extremely effective at reducing or eliminating capacitive coupling between signal lines 106, 108, 110. Since vias 302A, 304A are provided at the natural intersection of shield lines 102, 104 and shield line 300A, the prior art allocation of area for the various reference lines and vias needed to connect shield lines to a voltage source is avoided. Since this allocation of area is eliminated, area on the substrate is saved. Of importance, this saved area can be put to other uses, e.g., routing of necessary signal lines. In this manner, the efficiency of use of the substrate surface area is increased resulting in higher performance integrated circuits compared to the prior art.

Although shield line 300A, vias 302A, 304A are discussed in relation to shield lines 102, 104 of FIG. 3, a similar shield line 300B, and similar vias 302B, 304B in relation to shield lines 204, 202, respectively, of FIG. 5 can be used in accordance with the FIG. 5 embodiment.

The drawings and the forgoing description gave examples of the present invention. The scope of the present invention, however, is by no means limited by these specific examples. Numerous variations, whether explicitly given in the specification or not, such as differences in structure, dimension, and use of material, are possible. For example, although the use of an automated routing program with or without a geometric analyzer to design the various structures is discussed, it is understood that the structures can be design using other techniques, e.g. by hand. The scope of the invention is at least as broad as given by the following claims.

We claim:

1. A structure comprising:
   a first signal line;
   a second signal line;
   a first shield line positioned between but separated from said first signal line and said second signal line, said first shield line being unconnected to a voltage source; and
   a second shield line electrically connected to said first shield line by an electrically conductive via.

2. The structure of claim 1 wherein said first signal line, said second signal line and said first shield line are all part of a single conductor layer.

3. The structure of claim 1 wherein said first signal line, said second signal line, and said first shield line are each in a different conductor layer.

4. The structure of claim 1 wherein said first shield line has an area sufficient to prevent said first shield line from causing capacitive coupling between said first signal line and said second signal line to be greater than if said first shield line was not present.

5. The structure of claim 1 wherein said first shield line is part of a first conductor layer and said second shield line is part of a second conductor layer.

6. The structure of claim 1 wherein said via is provided at a natural intersection of said first shield line and said second shield line.

7. The structure of claim 1 wherein said voltage source is ground.

8. A structure comprising:
   a substrate;
   a first signal line above said substrate;
   a second signal line above said substrate, wherein unused substrate surface area exists between said first signal line and said second signal line;
   a first shield line in said unused substrate surface area, said first shield line being unconnected to a voltage source; and
   a second shield line electrically connected to said first shield line by an electrically conductive via.

9. The structure of claim 8 wherein a distance between said first signal line and said second signal line is at least equal to twice the minimum distance allowable between features plus the minimum allowable width of a feature.

10. The structure of claim 8 wherein said first shield line has a width greater than the minimum allowable width of a feature.

11. The structure of claim 8 wherein said first shield line has a first portion and a second portion, said first portion having a greater width than said second portion.

12. The structure of claim 8 wherein said first shield line is part of a first conductor layer and said second shield line is part of a second conductor layer.

13. The structure of claim 8 wherein said via is provided at the natural intersection of said first shield line and said second shield line.

14. The structure of claim 8 wherein said voltage source is ground.

* * * * *